US00RE43685E

(19) United States
(12) Reissued Patent
Sanchez

(10) Patent Number: US RE43,685 E
(45) Date of Reissued Patent: Sep. 25, 2012

(54) APPARATUS AND METHOD FOR MEASUREMENT FOR DYNAMIC LASER SIGNALS

(75) Inventor: Jorge Sanchez, Poway, CA (US)

(73) Assignee: Tecey Software Development KG, LLC, Dover, DE (US)

(21) Appl. No.: 13/048,743

(22) Filed: Mar. 15, 2011

Related U.S. Patent Documents

Reissue of:
(64) Patent No.: 7,505,498
Issued: Mar. 17, 2009
Appl. No.: 10/513,091
PCT Filed: Jan. 8, 2003
PCT No.: PCT/US03/00463
§ 371 (c)(1),
(2), (4) Date: Oct. 29, 2004
PCT Pub. No.: WO2004/064210
PCT Pub. Date: Jul. 29, 2004

U.S. Applications:
(60) Provisional application No. 60/346,728, filed on Jan. 8, 2002.

(51) Int. Cl.
*H01S 3/30* (2006.01)
*H01S 3/00* (2006.01)

(52) U.S. Cl. ..... 372/38.1; 372/8; 372/38.02

(58) Field of Classification Search ..... 372/8, 38.1, 372/38.02
See application file for complete search history.

(56) References Cited

U.S. PATENT DOCUMENTS 3,346,811 A 10/1967 Perry
4,000,397 A 12/1976 Hebert et al.
4,164,036 A 8/1979 Wax
4,168,398 A 9/1979 Matsuo et al.
4,290,146 A 9/1981 Adolfsson
4,290,297 A 9/1981 Anderson
4,471,494 A 9/1984 Keil et al.
4,553,268 A 11/1985 Tilly
4,558,465 A 12/1985 Siegel et al.
(Continued)

FOREIGN PATENT DOCUMENTS

DE 4028966 3/1992
(Continued)

OTHER PUBLICATIONS

International Search Report for International Application No. PCT/US03/00463, mailed Jul. 30, 2003.

(Continued)

*Primary Examiner* — Armando Rodriguez
(74) *Attorney, Agent, or Firm* — Schwabe, Williamson & Wyatt, P.C.

(57) ABSTRACT

A system contains a laser output measurement circuit used in a laser control system (210). The circuits contain a photodiode sensor (109), sample and hold amplifier (202), IC with synchronizer and delay circuits (206), and an analog to digital converter (204). The circuits measure the laser light output (107) while the laser Module (106) transmits signals. The measurement circuit tracks and stores the laser light output (107) signal using a Photodiode Sensor (109) and with a Sample/hold (202). The methods calculate the value of the laser light output (107) from mathematical relationships, which correlate the light output (107) of the laser Module (106) to the current value of the drive signal (100). Some of the distinguishing features in the present invention are 1) feedback information from the photodiode is obtained in a synchronous manner as a snapshot of the laser performance, and 2) the measurements are precise and calibrated, and 3) no disruption of the signal transmission occurs.

20 Claims, 7 Drawing Sheets

U.S. PATENT DOCUMENTS

| | | | |
|---|---|---|---|
| 4,677,536 | A | 6/1987 | Pepper |
| 4,734,873 | A | 3/1988 | Malloy |
| 4,745,361 | A | 5/1988 | Nees et al. |
| 4,758,779 | A | 7/1988 | Thong |
| 4,796,266 | A | 1/1989 | Banwell et al. |
| 4,875,006 | A | 10/1989 | Henley et al. |
| 4,910,458 | A | 3/1990 | Forsyth et al. |
| 4,939,446 | A | 7/1990 | Rogers |
| 4,942,534 | A | 7/1990 | Yokoyama et al. |
| 4,994,675 | A | 2/1991 | Levin et al. |
| 4,995,105 | A | 2/1991 | Wechsler et al. |
| 4,996,478 | A | 2/1991 | Pope |
| 5,019,769 | A | 5/1991 | Levinson |
| 5,021,647 | A | 6/1991 | Tatsuno et al. |
| 5,103,453 | A | 4/1992 | Kebabian et al. |
| 5,107,202 | A | 4/1992 | Renda |
| 5,113,131 | A | 5/1992 | Cooper et al. |
| 5,136,237 | A | 8/1992 | Smith |
| 5,153,765 | A | 10/1992 | Grunziger |
| 5,164,662 | A | 11/1992 | Emery et al. |
| 5,181,026 | A | 1/1993 | Granville |
| 5,197,778 | A | 3/1993 | Burst |
| 5,267,769 | A | 12/1993 | Bonne et al. |
| 5,268,916 | A | 12/1993 | Slawson et al. |
| 5,272,434 | A | 12/1993 | Meyrueix |
| 5,311,116 | A | 5/1994 | Rogers |
| 5,334,826 | A | 8/1994 | Sato et al. |
| 5,410,145 | A | 4/1995 | Coroy |
| 5,414,345 | A | 5/1995 | Rogers |
| 5,463,461 | A | 10/1995 | Horiuchi et al. |
| 5,500,517 | A | 3/1996 | Caghostro |
| 5,502,298 | A | 3/1996 | Geller et al. |
| 5,514,864 | A | 5/1996 | Mu-Tung et al. |
| 5,526,164 | A | 6/1996 | Link et al. |
| 5,558,389 | A | 9/1996 | Rothe et al. |
| 5,574,270 | A | 11/1996 | Steffen |
| 5,574,273 | A | 11/1996 | Nakagawa et al. |
| 5,579,328 | A | 11/1996 | Habel et al. |
| 5,583,444 | A | 12/1996 | Nakamura et al. |
| 5,625,616 | A | 4/1997 | Koike et al. |
| 5,680,056 | A | 10/1997 | Ito et al. |
| 5,706,116 | A | 1/1998 | Sugata |
| 5,721,579 | A | 2/1998 | Ogasawara et al. |
| 5,724,170 | A | 3/1998 | Aizawa |
| 5,774,669 | A | 6/1998 | George et al. |
| 5,812,572 | A | 9/1998 | King et al. |
| 5,816,644 | A | 10/1998 | Rothe et al. |
| 5,844,928 | A | 12/1998 | Shastri et al. |
| 5,850,370 | A | 12/1998 | Stringer et al. |
| 5,875,296 | A | 2/1999 | Shi et al. |
| 5,889,802 | A | 3/1999 | Walker |
| 5,949,606 | A | 9/1999 | Kaaden et al. |
| 5,967,593 | A | 10/1999 | Schuler et al. |
| 5,975,619 | A | 11/1999 | Dettling et al. |
| 5,982,794 | A | 11/1999 | Tamura |
| 6,002,099 | A | 12/1999 | Martin et al. |
| RE36,491 | E | 1/2000 | Gilliland et al. |
| 6,028,423 | A | 2/2000 | Sanchez |
| 6,049,828 | A | 4/2000 | Dev et al. |
| 6,055,252 | A | 4/2000 | Zhang |
| 6,057,678 | A | 5/2000 | Tagiri et al. |
| 6,145,743 | A | 11/2000 | Dvorkis et al. |
| 6,157,950 | A | 12/2000 | Krishnan |
| 6,270,728 | B1 | 8/2001 | Wijnschenk et al. |
| 6,276,605 | B1 | 8/2001 | Olmstead et al. |
| 6,282,218 | B1 | 8/2001 | Anderson |
| 6,364,396 | B1 | 4/2002 | Hayashi et al. |
| 6,370,175 | B1 | 4/2002 | Ikeda et al. |
| 6,377,987 | B1 | 4/2002 | Kracht |
| 6,384,590 | B1 | 5/2002 | Kikuchi et al. |
| 6,396,062 | B1 | 5/2002 | Buck et al. |
| 6,414,974 | B1 | 7/2002 | Russell et al. |
| 6,454,342 | B2 | 9/2002 | Heselhaus et al. |
| 6,454,343 | B1 | 9/2002 | Wagner et al. |
| 6,490,302 | B1 | 12/2002 | Koishi et al. |
| 6,502,891 | B2 | 1/2003 | Russke |
| 6,574,662 | B2 | 6/2003 | Sugiyama et al. |
| 6,574,737 | B1 | 6/2003 | Kingsford et al. |
| 6,580,531 | B1 | 6/2003 | Swanson et al. |
| 6,907,055 | B2 | 6/2005 | Morley et al. |
| 7,381,935 | B2 | 6/2008 | Sada et al. |
| 7,421,308 | B2 | 9/2008 | Nussbaum et al. |
| 7,608,806 | B2 | 10/2009 | Draper et al. |
| 2001/0024459 | A1* | 9/2001 | Seo et al. ..... 372/29.021 |
| 2002/0105982 | A1 | 8/2002 | Chin et al. |
| 2002/0175287 | A1 | 11/2002 | Busch et al. |
| 2003/0066947 | A1 | 4/2003 | Alwan et al. |
| 2004/0136423 | A1 | 7/2004 | Coldren et al. |
| 2004/0196754 | A1 | 10/2004 | Mashimo |
| 2004/0197101 | A1 | 10/2004 | Sasser et al. |
| 2005/0030744 | A1 | 2/2005 | Ducharme et al. |
| 2007/0069155 | A1 | 3/2007 | Mirro et al. |

FOREIGN PATENT DOCUMENTS

| | | |
|---|---|---|
| DE | 9303877 | 5/1993 |
| DE | 29514423 | 11/1995 |
| DE | 19507809 | 9/1996 |
| DE | 19912893 | 9/2000 |
| DE | 19959700 | 2/2001 |
| EP | 302453 | 2/1989 |
| EP | 0344091 | 11/1989 |
| EP | 0638453 | 2/1995 |
| EP | 0759666 | 2/1997 |
| GB | 2192510 | 1/1998 |
| JP | 57190436 | 11/1982 |
| JP | 61012138 | 1/1986 |
| WO | 9934542 | 7/1999 |
| WO | 03067510 | 8/2003 |

OTHER PUBLICATIONS

Notice of Allowance for EP Application No. 03 701 250.7, issued Sep. 1, 2008.

Restriction Requirement for U.S. Appl. No. 10/513,091, mailed Apr. 11, 2007.

Restriction Requirement for U.S. Appl. No. 10/513,091, mailed Jul. 30, 2007.

Notice of Allowance for U.S. Appl. No. 10/513,091, mailed Jul. 2, 2008.

International Search Report for Application No. PCT/US05/013561, mailed Sep. 9, 2005.

Non Final Office Action for U.S. Appl. No. 11/111,335, mailed Jul. 23, 2007.

Non Final Office Action for U.S. Appl. No. 10/561,546, mailed Mar. 5, 2008.

Final Office Action for U.S. Appl. No. 10/561,546, mailed Dec. 8, 2008.

Non Final Office Action for U.S. Appl. No. 10/561,546, mailed May 22, 2009.

Final Office Action for U.S. Appl. No. 10/561,546, mailed Nov. 25, 2009.

Notice of Allowance for U.S. Appl. No. 10/561,546, mailed Jan. 29, 2010.

International Search Report for Application No. PCT/DE03/03280, mailed Mar. 22, 2004.

Notice of Allowance for U.S. Appl. No. 10/531,091, mailed Mar. 11, 2008.

International Search Report for Application No. PCT/US03/01032, mailed Jun. 18, 2003.

Non Final Office Action for U.S. Appl. No. 10/513,105, mailed Apr. 6, 2007.

Final Office Action for U.S. Appl. No. 10/513,105, mailed Dec. 31, 2007.

Non Final Office Action for U.S. Appl. No. 10/513,105, mailed Sep. 3, 2008.

Final Office Action for U.S. Appl. No. 10/513,105, mailed Feb. 19, 2009.

Non Final Office Action for U.S. Appl. No. 10/513,105, mailed Aug. 4, 2009.

Non Final Office Action for U.S. Appl. No. 09/772,709, mailed Jun. 3, 2004.

Final Office Action for U.S. Appl. No. 09/772,709, mailed Jan. 26, 2005.

Non Final Office Action for U.S. Appl. No. 09/772,709, mailed Aug. 19, 2005.
Non Final Office Action for U.S. Appl. No. 09/772,709, mailed Nov. 30, 2006.
Final Office Action for U.S. Appl. No. 09/772,709, mailed Jun. 28, 2007.
Non Final Office Action for U.S. Appl. No. 09/772,709, mailed Apr. 4, 2008.
Final Office Action for U.S. Appl. No. 09/772,709, mailed Jan. 6, 2009.
Notice of Allowance for U.S. Appl. No. 09/772,709, mailed Sep. 3, 2009.
International Search Report for Application No. PCT/US02/40940, mailed Apr. 4, 2003.
Non Final Office Action for U.S. Appl. No. 10/679,553, mailed Oct. 4, 2005.
Non Final Office Action for U.S. Appl. No. 11/397,651, mailed Jun. 29, 2006.
Notice of Allowance for U.S. Appl. No. 11/397,651, mailed Nov. 9, 2006.
International Search Report for Application No. PCT/US00/35123, mailed Mar. 4, 2001.
International Search Report for Application No. PCT/US00/35125, mailed Sep. 8, 2002.
Non Final Office Action for U.S. Appl. No. 11/537,504, mailed Mar. 12, 2010.
Notice of Allowance for U.S. Appl. No. 11/537,504, mailed Aug. 19, 2010.
International Search Report for Application No. PCT/US95/00215, mailed May 24, 1995.
Non Final Office Action for U.S. Appl. No. 10/512,931, mailed Jul. 1, 2005.
Final Office Action for U.S. Appl. No. 10/512,931, mailed Dec. 29, 2005.
Notice of Allowance for U.S. Appl. No. 10/512,931, mailed Aug. 25, 2006.
International Search Report for Application No. PCT/US03/00848, mailed Jul. 30, 2003.
Non Final Office Action for U.S. Appl. No. 12/364,482, mailed Mar. 24, 2010.
Notice of Allowance for U.S. Appl. No. 12/364,482, mailed Sep. 17, 2010.
European Office Action for EP Application No. 5746735.9, mailed Mar. 6, 2009.

* cited by examiner

Control system block diagram

Output Signal Sampler

Embodiment of Output Signal Sampler

Calibration Process Timing Diagram

Field Calibration Circuit

Power Measurement
Calibration

Factory Calibration

APPARATUS AND METHOD FOR MEASUREMENT FOR DYNAMIC LASER SIGNALS

Matter enclosed in heavy brackets [ ] appears in the original patent but forms no part of this reissue specification; matter printed in italics indicates the additions made by reissue.

CROSS-REFERENCE TO RELATED APPLICATIONS

This application is a National Stage of PCT/US2003/000463, filed Jan. 8, 2003, which claims the benefit of U.S. Provisional Application No. 60/346,728, filed Jan. 8, 2002.

BACKGROUND

1. Field of the Invention

The present invention relates to a circuit and method used to calibrate and compensate for laser performance in systems such as an optical communications links, medical diagnostic systems and any other system utilizing lasers. Performance compensation is achieved in a non-invasive manner without disruption of the laser signal transmission or other operating parameters of the laser.

2. Description of the Related Art

Market trends demand increased levels of reliability and intelligence in laser systems. Particularly, in laser signal transmission there is the need to send information with reliable optical power signals. Reliability requires the transmitted signals to maintain a given signal strength as well as other performance parameters. Lasers undergo degradation due to aging, temperature changes, and other effects. This degradation causes the signal strength to be reduced resulting in a decrease of signal-to-noise ratio, extinction ratio and an increased Bit Error Rate.

Prior art has utilized either analog controllers or mixed analog/digital controllers as opposed to the Digital Controller (111) shown in FIG. 1 below in the detailed description.

Challenges with the Measurement process.

In order to properly control the laser Module (106), the Digital Controller (111) requires feedback information from light output (107). When the control system is operational, obtaining feedback information becomes problematic since the light output (107) constantly changes depending on the Drive Signal (100) the system is transmitting. Thus any attempts to measure the light output (107) will encounter errors, which can render the feedback information unusable.

To perform a measurement of the light output (107), the Drive Signal (100) needs to be maintained at a fixed power level in order for the system to produce a steady value of the Light Output (107) so that calibration adjustments can be made. This procedure disrupts the signal transmission and, because of this, the transmitter cannot send information over the optical communications channel while the calibration is carried out. Disruption in communication is contrary to the goals of high reliability and 100% up time in present systems.

If the Photodiode Sensor (109) is slow relative to the Laser Module (106), once the system is transmitting information, the Photodiode Sensor (109) cannot be effectively utilized to calibrate the amplitude of the Light Output (107) because the sensor may have a slower response than the laser. The Photodiode Sensor (109) operates as a band-limiting filter converting the response to a variety of waveforms as follows:

An exponential rise and decay of the Photodiode Sensor (109) output is produced for a serial stream of the Drive Signal (100) comprised of all ones. For this data sequence, the average of the Photodiode Sensor (109) will exhibit the highest value;

A Photodiode Sensor (109) output with an average value close to zero volts will be obtained for a serial stream of the Drive Signal (100) comprised of all zeros;

The output of the Photodiode Sensor (109) will exhibit an average voltage value, which will between the maximum and minimum values described above depending on a generic sequence of date with mixed values of ones and zeros.

To carry out a power measurement of the light output (107), the prior art has utilized a variety of methods. In one method the process has been as follows.

The digital input Drive Signal (100) is disconnected and a peak value of analog current from the Modulation Current Generator (103) is applied to the laser;

The Light Output (107) is measured with an optical power meter.

The Photodiode Sensor (109) generates a corresponding signal proportional to the light output;

Adjustments are made in the Controller (111) in order to increase the magnitude of the optical power coming out of the laser to the desired level;

The adjustments in the Controller (111) affect the Bias Current Generator (102) and Modulation Current Generator (103), which in turn affect the Light Output (107) of the Laser Module (106);

This approach has the disadvantage of requiring disconnection of the laser control system (114). Disconnection in many systems, such as communications equipment, is not acceptable.

The process for another possible solution previously used is as follows:

Produce a circuit to synthesize a high frequency calibration signal;

Inject the calibration signal into the node between the Modulation Current Generator (103) and the laser module (106);

Sense the calibration signal with the Photodiode Sensor (109);

Add a special filter circuit between the photodiode sensor (109) and the Digital Controller (111);

Detect the magnitude of the calibration signal with the Digital Controller (111).

The problem with this solution is that it affects the information transmitted. This prior art solution has a significant impact on the reliability of information transmission because it essentially inserts noise into the transmitted signal. Furthermore this approach increases complexity and cost due to an additional calibration signal generator, a calibration signal injection circuit, plus filter and detection circuits.

Because of errors in power measurement, transmission systems in prior art generally overdrive the laser to account for variations of temperature, aging and other effects. This approach significantly reduces the life of the laser.

SUMMARY OF THE INVENTION

The present invention provides a circuit and a method for calibrating the Light Output (107) of the laser without affecting the data transmission. This is consistent with goals of high reliability because at no time is the data transmission disrupted.

The present system contains a laser output measurement circuit used in a laser control system (114). The circuits contain a photodiode sensor (200), sample and hold amplifier (202), IC with synchronizer and delay circuits (206), and an analog to digital converter (204). The circuits measure the laser light output (107) while the laser Module (106) transmits signals. The measurement circuit tracks and stores the laser light output (107) signal using a Photodiode Sensor (109) and with a Sample/hold (202). The methods calculate the value of the laser light output (107) from mathematical relationships, which correlate the light output (107) of the laser Module (106) to the current value of the drive signal (100). Some of the distinguishing features in the present invention are 1) feedback information from the photodiode is obtained in a synchronous manner as a snapshot of the laser performance, and 2) the measurements are precise and calibrated, and 3) no disruption of the signal transmission occurs.

An advantage of this invention is that laser power amplitude can be calibrated without interrupting the flow of information transmission.

Another advantage of this invention is that the system can utilize multiple types of output responses from the Photodiode Sensor with the utilization of the appropriate correlation algorithm.

Another advantage of this invention is that the transmitter optical power can be continuously maintained at the optimal value to achieve the target Extinction Ratio, Bit Error Rate and analog signal level.

Another advantage of this invention is that the laser can be compensated for degradation due to aging.

Yet another advantage of this invention is that adjustments to account for temperature changes, aging and other effects are done only as needed and by the amount needed. This contributes to extending the life of the laser.

BRIEF DESCRIPTION OF THE DRAWINGS

Details of the invention, and of the preferred embodiment thereof, will be further understood upon reference to the drawings, wherein closely related elements have the same number but different alphabetical suffixes, and further wherein.

DETAILED DESCRIPTION OF THE PREFERRED EMBODIMENTS

The above-mentioned difficulties and problems of the prior art are overcome by the present invention.

Apparatus

Figure 1:
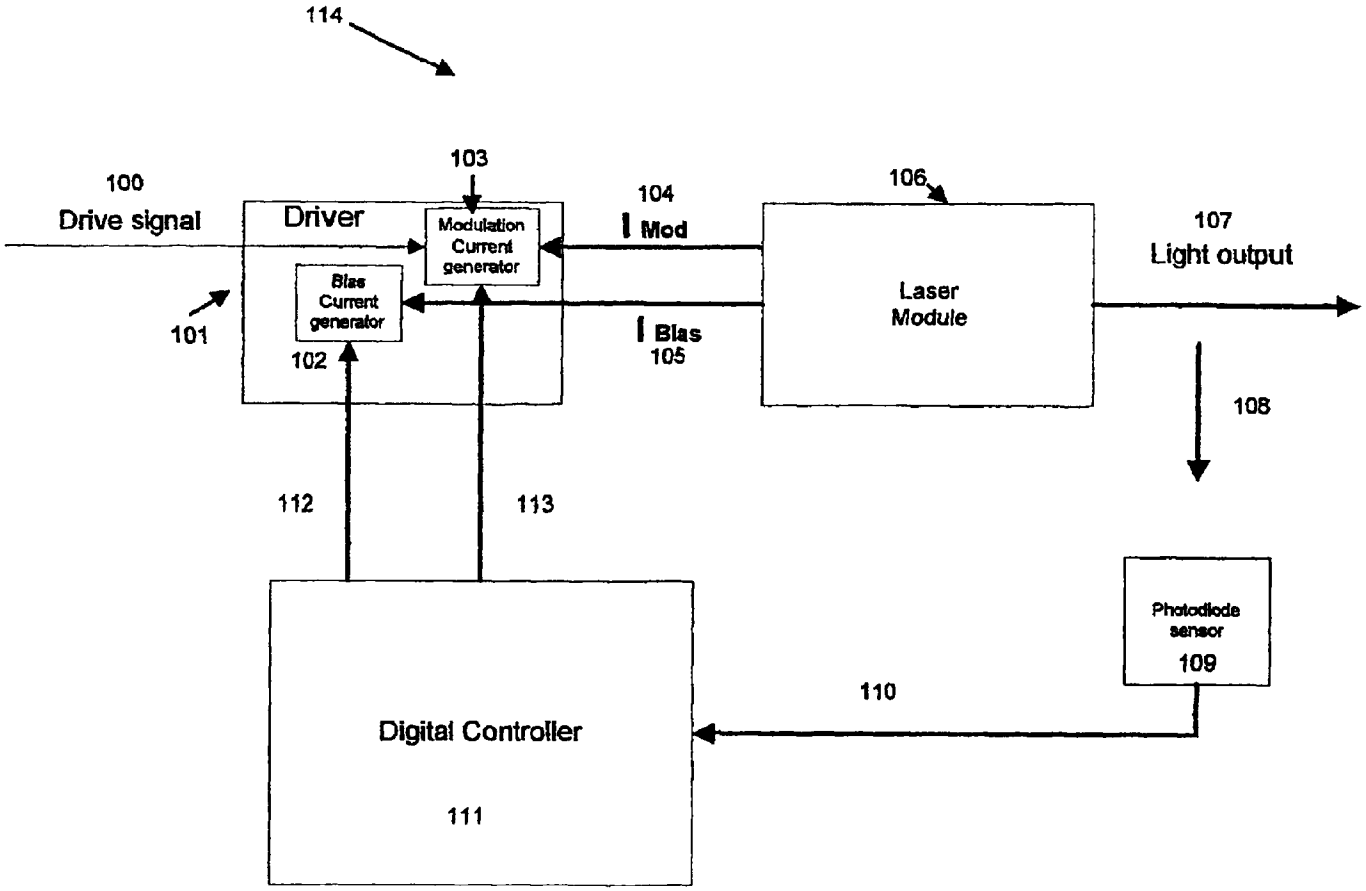
FIG. 1 illustrates a control system diagram for a laser transmitter. This control system shows a configuration presented in previous applications of the same inventor.

Referring to FIG. 1, a block diagram is shown for a Laser Control System (114). The system consists of a drive Signal Input (100) applied to a Laser Module Driver (101), which contains a Bias Current Generator (102) and a Modulation Current Generator (103). A Bias Control Signal (112) and a Modulation Control Signal (113) control the current generators. The Driver (101) produces Modulation Current (104) and Bias Current (105) that are applied to the Laser Module (106). The Laser Module (106) in turn produces Light Output (107). The magnitude of the Light Output (107) bears a relationship to the magnitude of the Modulation Current (104) and the Bias Current (105). A portion of the Light Output (107) from the laser is sensed. This portion constitutes the Optical Power Sense (108), which is coupled to a Photodiode Sensor (109). The Photodiode Sensor Output (110) is connected to a Digital Controller (111). The Digital Controller (111) contains algorithms for laser control and also determines the magnitudes of the Bias Current Generator (102) and Modulation Current (103).

Figure 2:
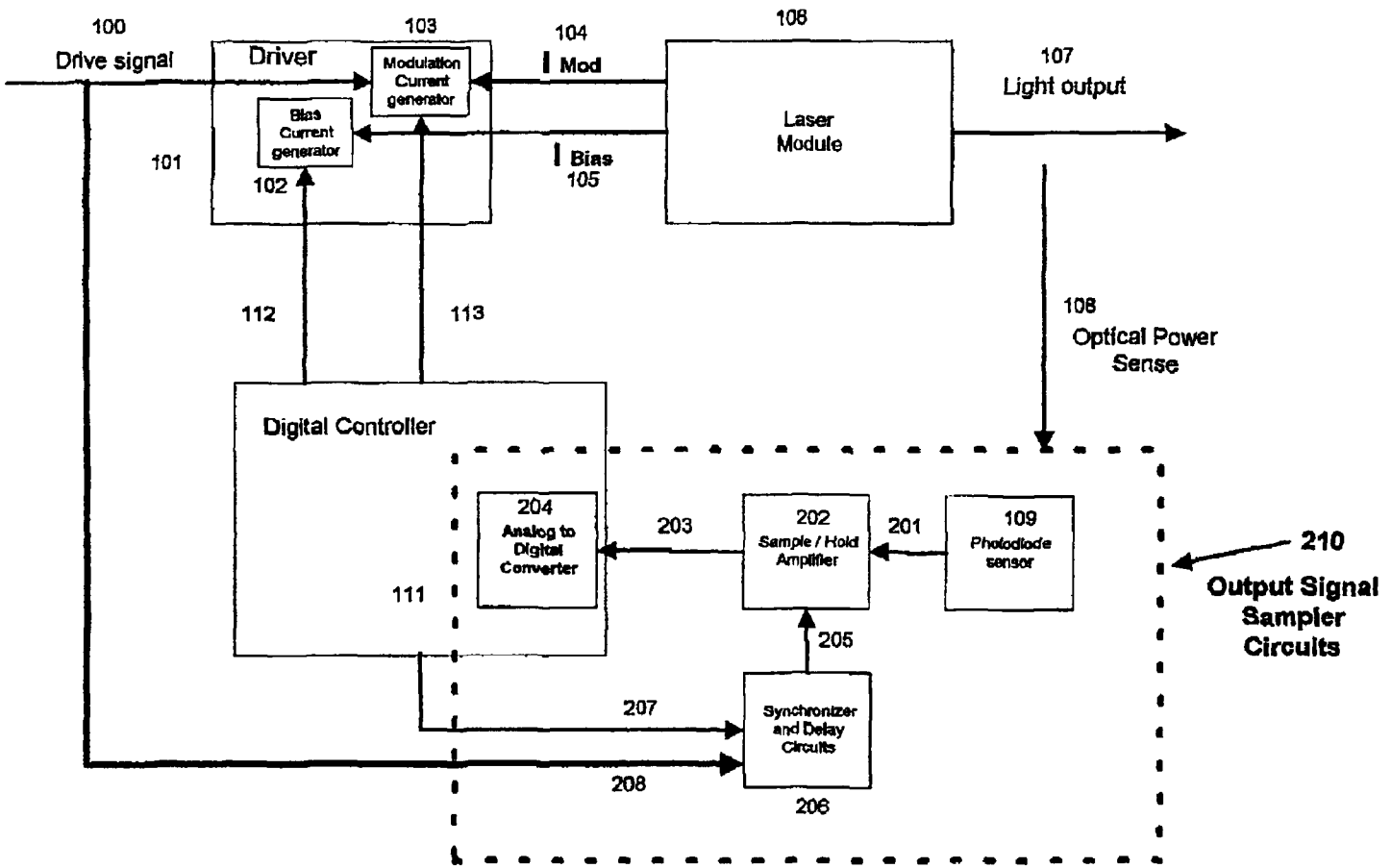
FIG. 2 illustrates a diagram of the Output Signal Sampler.

FIG. 2 shows the output signal sampler apparatus of this invention. This consists of a Photodiode Sensor (109), which generates a Photodiode Signal (201) in response to the application of a portion of the Laser Light Output (107). The Photodiode Output may be a fast response or an exponential rise and decay signal. The Sample and Hold Amplifier (202) receives the Photodiode Sensor Signal (201) and stores the value of the signal at the appropriate time as directed by the Sample and Hold Control (205). Once the Sample and Hold Amplifier (202) has stored the signal, it is sent to the Analog to Digital Converter (204), which is contained in the Digital Controller (111). The Sample and Hold Amplifier (202) is connected to the Analog to Digital Converter (204).

The Sample and Hold Control (205) is produced by the Synchronizer and Delay Circuits (206). These circuits utilize real-time information of the state of the Drive Signal (100), which connects to the Drive Signal (100) at (208) in order to determine when the Sample and Hold Control (205) is activated. The Synchronizer and Delay Circuits (206) are controlled by the Digital Controller (111) with the necessary Logic Output (207). The Digital Controller (111) contains algorithms that are capable of utilizing a multiplicity of Photodiode Sensor information including an exponential rise and decay, a square wave response, and an average signal output. The algorithms utilize information related to the sequence of values of the Drive Signal (100) input and correlate those values to the magnitude of the Photodiode Sensor (109) output. In addition, the controller can then make adjustments to the Bias Current (105) and Modulation Current (104), in order to optimize the extinction ratio and the Bit Error Rate.

Figure 3:
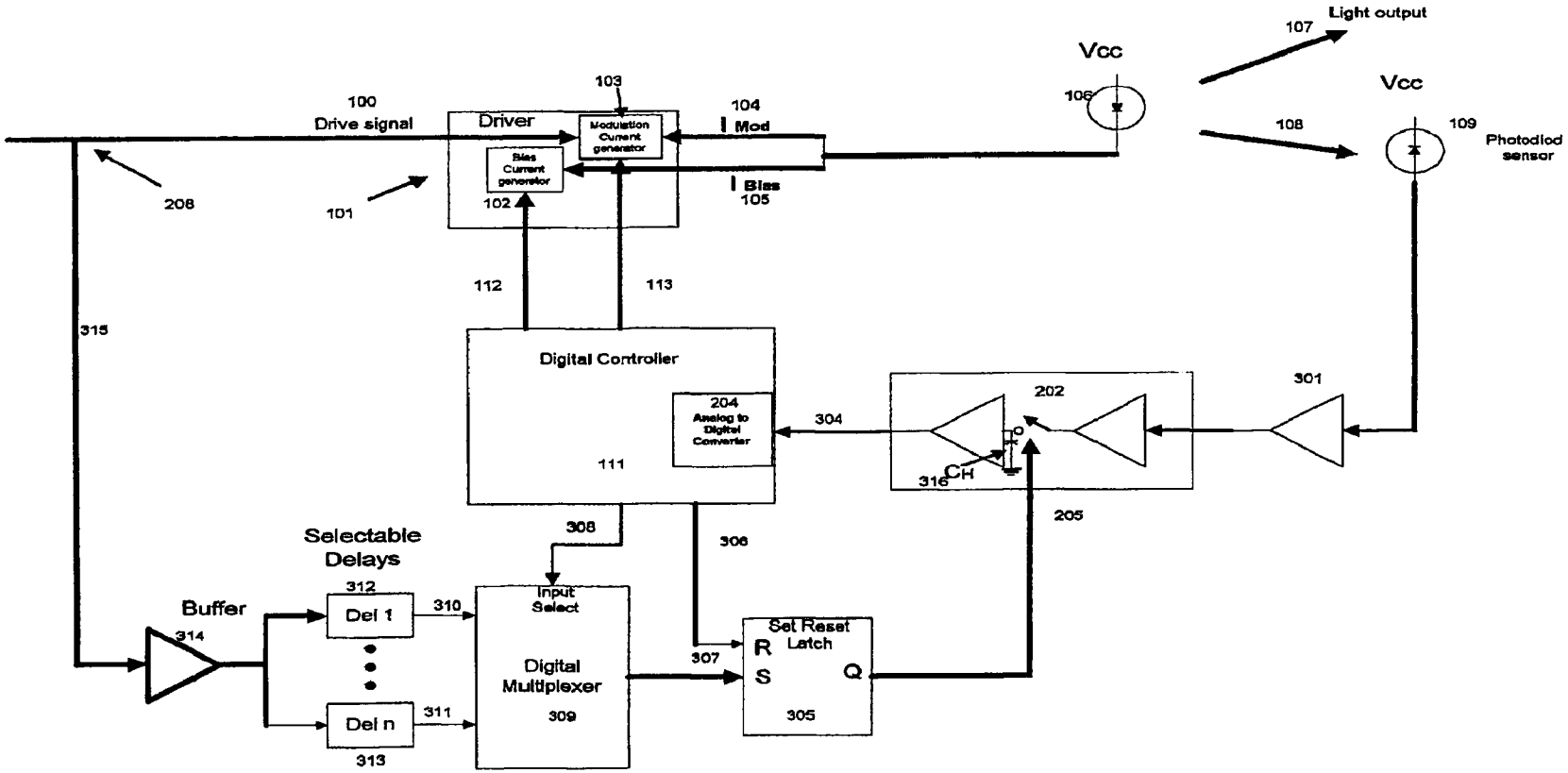
FIG. 3 illustrates an embodiment of the Output Signal Sampler.

FIG. 3 is an embodiment of the Output Signal Sampler in this invention. The Drive Signal (100) applied to the Driver (103) produces a Light Output (107). A portion of the optical power is coupled to the Photodiode Sensor (109). The Photodiode Sensor (109) produces a current, which is converted to a voltage by the Transimpedance Amplifier (301). This voltage drives the Sample and Hold Amplifier [(302)] *(202)*, which in turn produces a steady sample of the sensor signal at (304) to the Analog to Digital Converter (304). The Sample and Hold Amplifier (202) stores the sensor information in a Capacitor $C_H$ (316). The capacitor is chosen so that the capturing of the sensor signal is done at high speed while at the same time the capacitor maintains the value of the captured sensor signal during the analog to digital conversion. In general, for optical telecommunications, the capacitor may need to be relatively small in the tens of picofarads in order for the Sample and Hold Amplifier (202) to successfully track the sensor signal. The Transimpedance Amplifier (301) and the Sample and Hold Amplifier (202) are designed in such a way that they will be substantially faster then the Photodiode Sensor (109) in order to insure that the Photodiode Sensor (109) determines the frequency response. A critical feature of the present invention is the appropriate timing of the Sample and Hold Control (205). This control must be able to capture the Photodiode Sensor (109) signal at a predictable time in order to anticipate the state of the Drive Signal (100) and the Light Output (107). The timing synchronization circuit determines this. This circuit starts by sampling the Drive Signal (100) at (315). This is done with the use of a Buffer (314) in order to avoid a significant load on the Drive Signal (100). The output of the Buffer (314) is sent to a set of n signal propagation delays. These delays consist of Delay 1 (312) to Delay n (313). These delays connect to Digital Multiplexer (309) through Inputs (310) to (311). The Digital Controller utilizes the Input Select (308) of the Digital Multiplexer (309) in order to select any of the n signal propagation delays. A zero to one transmission of the Drive Signal (100) will cause, after a time delay, a zero to one transition at the Set Input (307) of the Set Reset Latch (305). This transition in turn causes a zero to one transition of the Sample and Hold Control (205), which places the Sample and Hold Amplifier (202) in hold mode in order to prepare the system for an analog to digital conversion. After the analog to digital conversion is completed the Set Reset Latch (305), is placed in reset mode by the Reset Signal (306) generated by the Digital Controller (111). This last step will then place the Sample and Hold Amplifier (202) in sample mode so that the system can be ready for the next calibration cycle.

FIG. 3 shows the propagation delays associated with the Output Signal Sampler.

The following definitions apply:

$t_1$=Buffer (314) input to output propagation delay $t_2$=Selected propagation delay.

$t_3$=Digital Multiplexer (309) propagation delay.

$t_4$=Set input to Output propagation delay for Set Reset Latch (305).

$t_5$=Propagation delay from Sample and Hold Control S/H (408) input to the opening of the internal switch in the Sample and Hold Amplifier (202).

$t_{Drive}$ (414)=Propagation delay across the Driver (103)+ time for the Laser (106) to switch logic state $t_{Sense}$ (406)=Time for the Photodiode Sensor (109) to respond+time for the Transimpedance Amplifier (301) to respond $t_{Capture}$ (414)=Time for the Sample and Hold Amplifier (202) to track the photodiode sensor signal.

$$t_{Synch}(415)=t_1+t_2+t_3+t_4+t_5 \quad \text{Equation 1.}$$

In order to maximize Vpeak (407), the following equation must be satisfied:

$$t_{Synch}(415)=t_{Drive}(414)+t_{Sense}(406)+t_{Capture}(414) \quad \text{Equation 2.}$$

When the S/H (408) is in hold mode after the transition at 409, the Analog to Digital Converter (204) performs an analog to digital conversion, which will last for a period of time $t_{A/D}$ (412). The duration of the analog to digital conversion can be relatively slow as required by the Analog to Digital Converter (204). At the end of the conversion, the Digital Controller (111) will cause the S/H (408) signal to experience a Reset (412) transition to the sample mode with the use of the Reset Control (306). The embodiment shown in FIG. 3 may utilize MOS technology components for a given data rate of transmission. Synchronization of the timing characteristics and delays as indicated by Equation 2 can be best achieved by including the Signal Sampler circuits of FIG. 3 in the same integrated circuit as the Driver (103). If a single integrated circuit is not available, then the Signal Sampler circuits must be implemented with the appropriate technology in order to match the speed requirements of the propagation delays associated with the laser Driver (103). Very fast Silicon Germanium and other technologies are available. In some applications, fine-tuning and modifications of the embodiment of FIG. 3 will be necessary to keep up with fast transmission rates. In these cases the same principles of the invention will apply and the task will consist of selecting the appropriate configuration of high-speed components.

Figure 4:
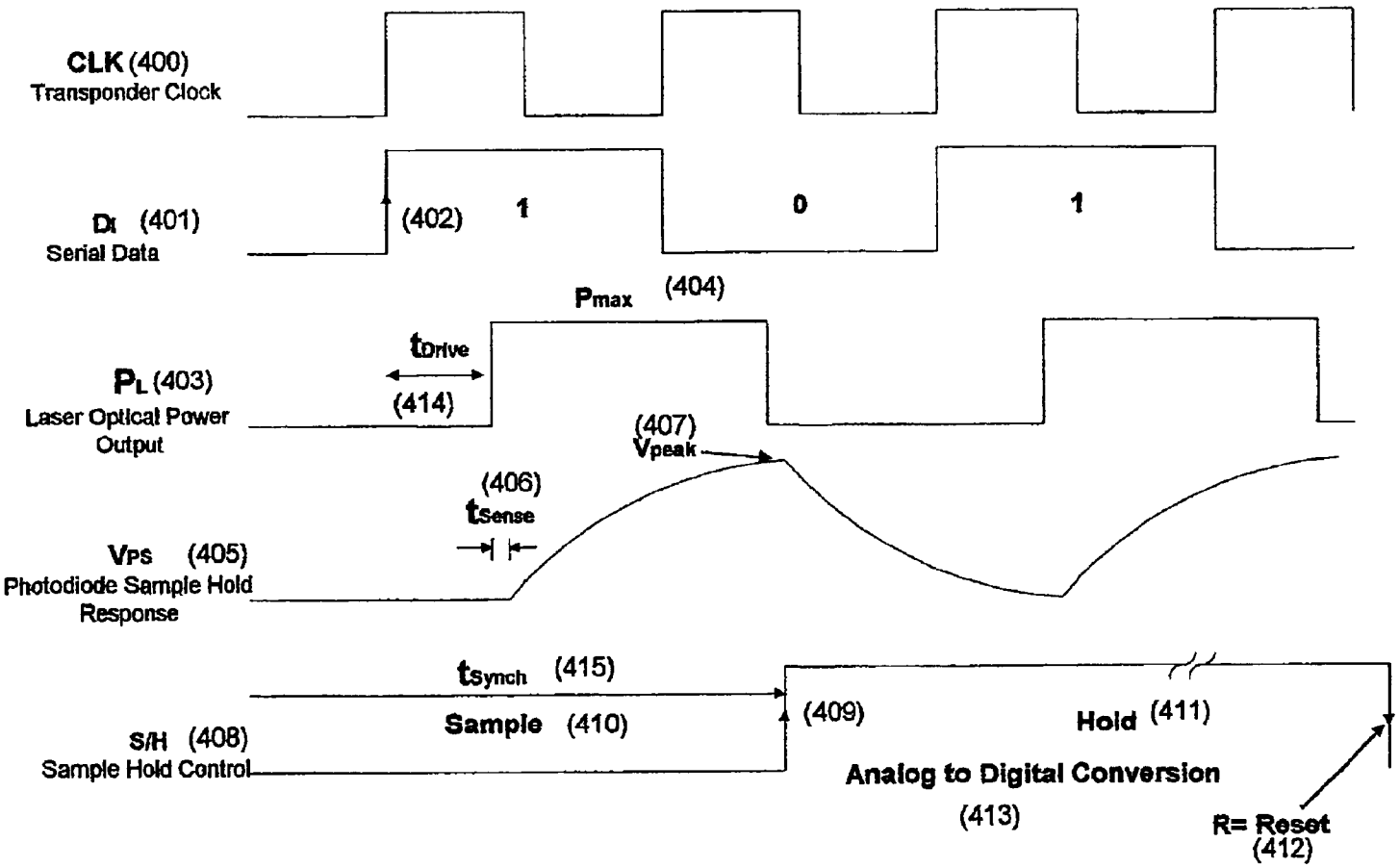
FIG. 4 illustrates the timing diagram for the calibration process.

FIG. 4 shows the timing of the in line calibration of the laser optical power. As a reference to the timing of the system consider the system clock that is utilized by the transponder. This is the clock CLK (400). The clock (400) is utilized in the system to generate Serial Data Di (401). In this example the Serial Data Di (401) consists of the sequence 101. The data transmission of the timing diagram in the illustration corresponds to NRZ-L. After the zero to one transition of the Serial Data Di at (402), the data flows through the Driver (103) and causes a zero to one transition in Laser Optical Power $P_L$ (403). This transition of the Laser Optical Power (403) happens after a delay $t_{Drive}$ (413), corresponding to the delay of the signal flowing through the Driver (103) and the Laser (106). A given setting of the Bias Current Generator (102) places the Laser (106) slightly above the threshold. This setting can be adjusted and [controller] *controlled* independently from the signal modulation current. For the purpose of calibrating the Light Output (107) focus on the control of the Modulation Current Generator (103). For the pulse of the Serial Data Di (401), there is a corresponding amplitude of the Laser Optical Power Output $P_L$ (403). The magnitude of the optical power is noted as Pmax (404). The laser optical power corresponding to the transmission of a logical 1 will vary depending on the setting of the Modulation Current Generator (103), the Laser (106) characteristics and the effects of factors such as temperature and aging on the Laser (106). The Photodiode Sample Hold Response $V_{PS}$ (405) will start sensing the Laser (106) output after a delay of $t_{sense}$ (406). The Sample and Hold Amplifier (202) will start increasing its voltage in an exponential manner reaching a maximum value Vpeak (407). High frequency models have been determined that demonstrate how the combination of amplifiers and Photodiode Sensor (109) can respond with an exponential rise and decay characteristic. Associated circuit components such as resistors and capacitors can be utilized to ensure there is a dominant pole response resulting in a controlled exponential characteristic without signal ringing. There can be high performance circuit implementations of the laser sensor circuits where the Photodiode sensor (109), Transimpedance Amplifier (301) and Sample and Hold Amplifier (202) exhibit a response with a bandwidth fast enough to keep up with the laser bandwidth. In this case, a rather fast rise and fall signal will result rather than the exponential rise and decay. The exponential rise and decay characteristic is illustrated here because it is fairly common for laser packages to be available with an integrated low-cost monitoring photodiode. These integrated packages normally have a monitoring photodiode that exhibits a slow frequency response.

After a delay of $t_{Synch}$ (415) from the zero to one transition of the Serial Data Di (401), the Sample and Hold Control S/H (408) will experience a transition from Sample (410) mode to Hold (411) mode at 409. Transition at this point in time ensures that it is possible to capture the maximum possible value of Vpeak (407). This will produce a higher resolution in our measurement system.

Method of Operation

Signal strength optimization of the Laser power sensor.

The Digital Controller (111), upon power up goes through an initialization process. Part of the initialization routine consists of a process used to optimize the sensor signal. The objective of the process is to maximize the value of Vpeak (407). Maximizing the value of Vpeak increases the resolution and accuracy of the laser power measurement system.

This is accomplished with an iterative process where the Digital Controller (111) will automatically select the timing delays one at a time and determine which produces the highest value of the Vpeak (407). This process can be carried out during the factory test of the transmitter. The needed value of the timing delay is then stored in the internal memory of the Digital Controller (111) so it can be used in the field. The process can also be carried out in the field with an addition to the circuit of FIG. 3.

Figure 5:
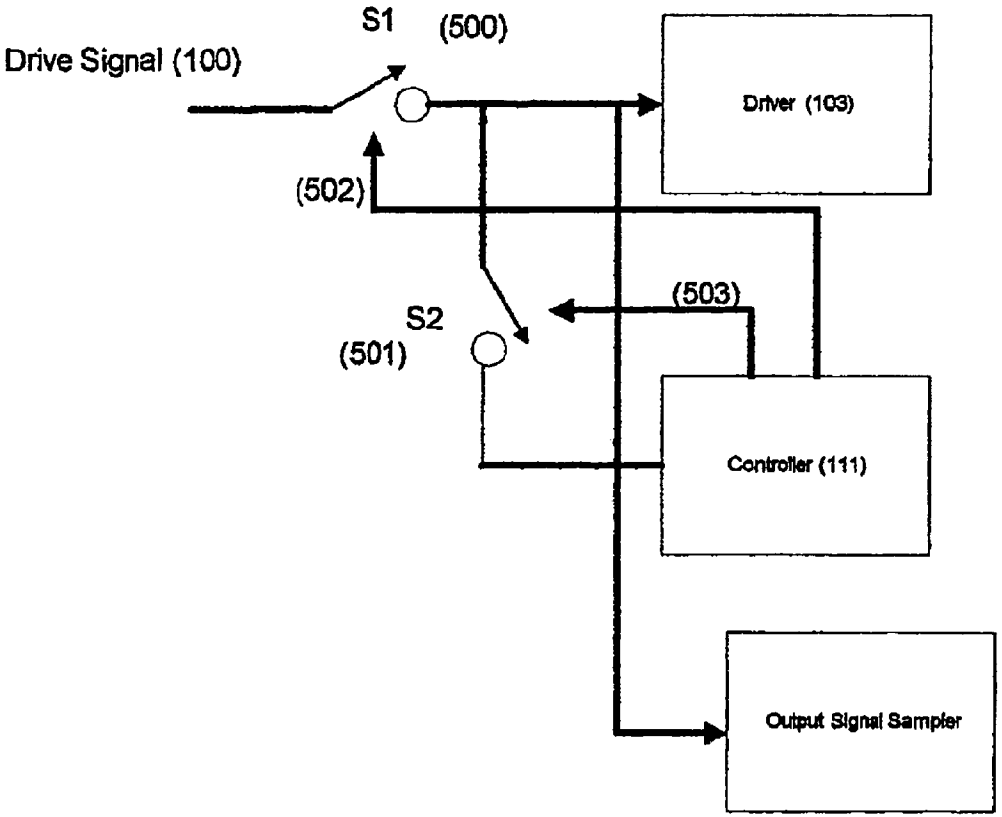
FIG. 5 illustrates a circuit, which can be used to facilitate field calibration.

This is illustrated in FIG. 5. The Controller (111) uses Switch Controls (502, 503) to control the switches S1 (500) and S2 (501). When Switch S1 (500) is opened, the Drive Signal (100) is disconnected. At the same time, the switch S2 (501) can be closed. This allows the Controller (111) to place a train of pulses into the Driver (103) in order to calibrate the timing of the Output Signal Sampler and to calibrate the Extinction Ratio.

Power sensor measurement calibration.

To carry out continuous laser performance compensation, this invention relies on correlating the photodiode sensor signal with the pattern of information transmitted over the optical communications link. By capturing and storing the data pattern information and the corresponding sensor signal, the controller (111) can compute the correlation algorithms. Many algorithms that can accommodate multiple system responses are possible. One example of the correlation is as follows. Consider the exponential rise and decay of the Photodiode Sample Hold Response (405). The Digital Controller (111) can allow the charge stored in the capacitor $C_H$ (316) to decay to zero volts prior to sampling the Laser power output response. The response of the Signal Sampler in FIG. 3 will be governed by the following equations:

Exponential Rise $$V(t)=V_m(1-e^{-t/RC}) \qquad \text{Equation 3.}$$

Where $V_m$ represents the asymptotic maximum value of the exponential rise response, R and C are the equivalent circuit constants and V(t) is the voltage at the Sample and Hold Amplifier (202).

Exponential Decay $$V(t)V_p e^{-t/RC} \qquad \text{Equation 4.}$$

Where $V_p$ represents the maximum value attained during the exponential rise response as determined by the circuit parameters and the data rate of transmission, R and C are the equivalent circuit constants and V(t) is the voltage at the Sample and Hold Amplifier (202).

Figure 6:
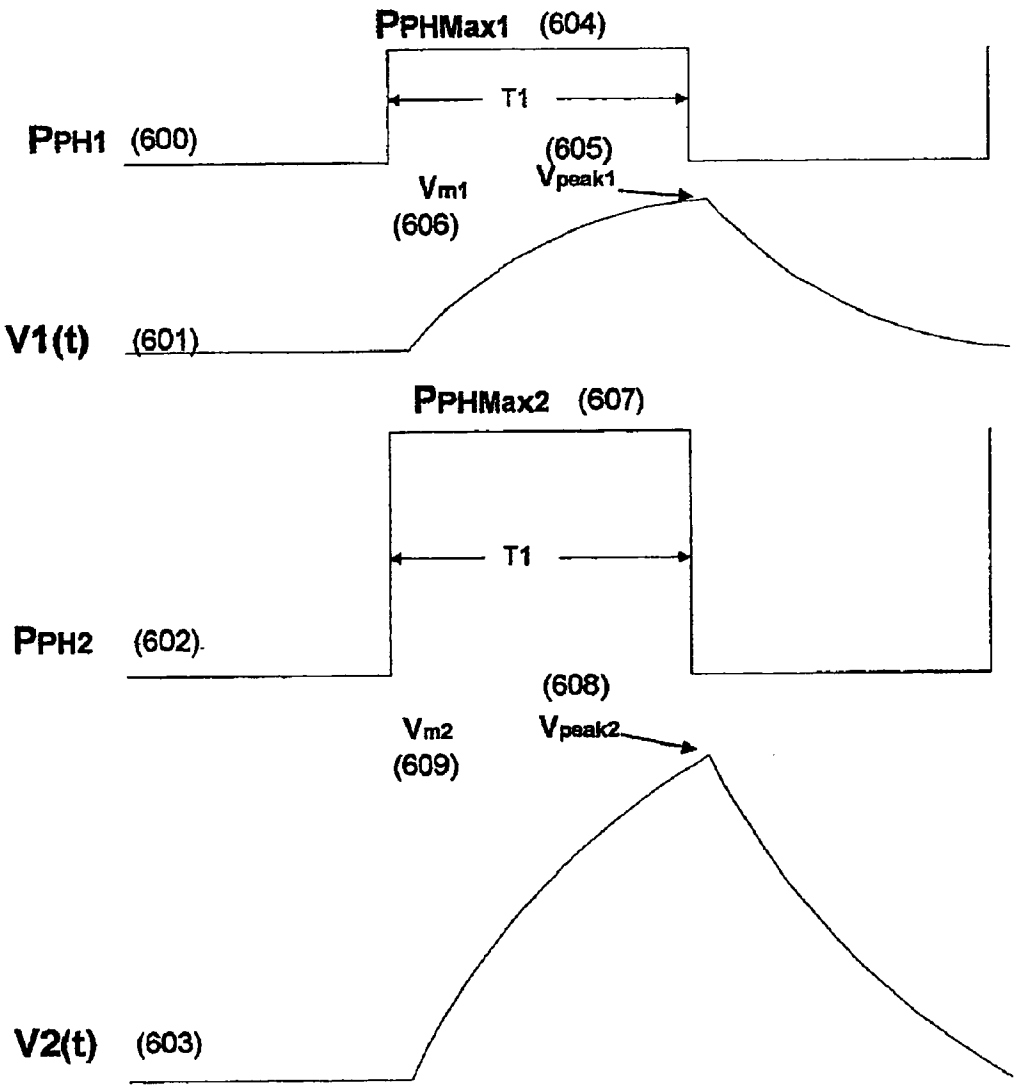
FIG. 6 illustrates the power measurement calibration.

FIG. 6 shows the power measurement calibration. The following definitions apply:

$P_{PH1}$ (600)=Laser power pulse received at the photodiode for a given setting of laser power output. This is proportional to the pulse of power that the laser emits in response to the logic one transmission.

$P_{PHMax1}$ (604)=Maximum value of Laser power pulse received at the photodiode. The magnitude of the photodiode power is determined by the Driver (103), Laser (106) and the amount of light coupled from the laser to the photodiode.

V1(t)(601)=Time dependent response of the photodiode (109) output, the Transimpedance Amplifier (301) and the Sample and Hold Amplifier (202). This response is the corresponding response to $P_{PH1}$ (600).

Vm1 (606)=Asymptotic value of the exponential response for V1(t)(601). This is proportional to $P_{PHMax1}$ (604). The proportionality constant is the Responsivity of the photodiode.

Vpeak1 (605)=Peak value of exponential response corresponding to the end of the pulse for the transmission of a logic one.

Similarly, for a different set of conditions, the laser will emit a pulse with a different level of power magnitude. The following definitions apply:

$P_{PH2}$ (602)=Laser power pulse received at the photodiode for a second setting of laser power output.

$P_{PHMax2}$ (607)=Maximum value of Laser power pulse received at the photodiode.

V2(t)(603)=Time dependent response of the photodiode (109) output, the Transimpedance Amplifier (301) and the Sample and Hold Amplifier (202). This response is the corresponding response to $P_{PH2}$ (602).

Vm2 (609)=Asymptotic value of the exponential response for V2(t)(603). This is proportional to $P_{PHMax2}$ (607). The proportionality constant is the Responsivity of the photodiode.

Vpeak2 (608)=Peak value of exponential response corresponding to the end of the pulse for the transmission of a logic one.

Focusing now on the corresponding equations the following relationships are obtained:

$$\text{Vpeak1}=V_{m1}(1-e^{-T1/R1C1}) \qquad \text{Equation 5.}$$

$$\text{Vpeak2}=V_{m2}(1-e^{-T1/R1C1}) \qquad \text{Equation 6.}$$

Where t has been submitted by T1 for a given value of period for a logic one transmission, in this case a constant. R1 and C1 correspondingly have substituted R, C since for a given circuit, the parameters are constant.

In general, equations 5 and 6 show how once the period and the circuit RC parameters are fixed, the quantity $(1-e^{-T1/R1C1})$ becomes a constant and the peak values of the exponential rise are dependent only on the asymptotic values of the photodiode response. The asymptotic values bear a linear relationship to the laser output power. In this case additional calibration processes need to be considered, which will control second order effects of the laser and photodiode transfer function such as temperature effects.

It is then concluded that the Vpeak (407) of the exponential rise and decay of the photodiode sensing circuits will vary linearly [would] *with* respect to the maximum amplitude Pmax (404) of the Laser Optical Power Output (403).

Figure 7:
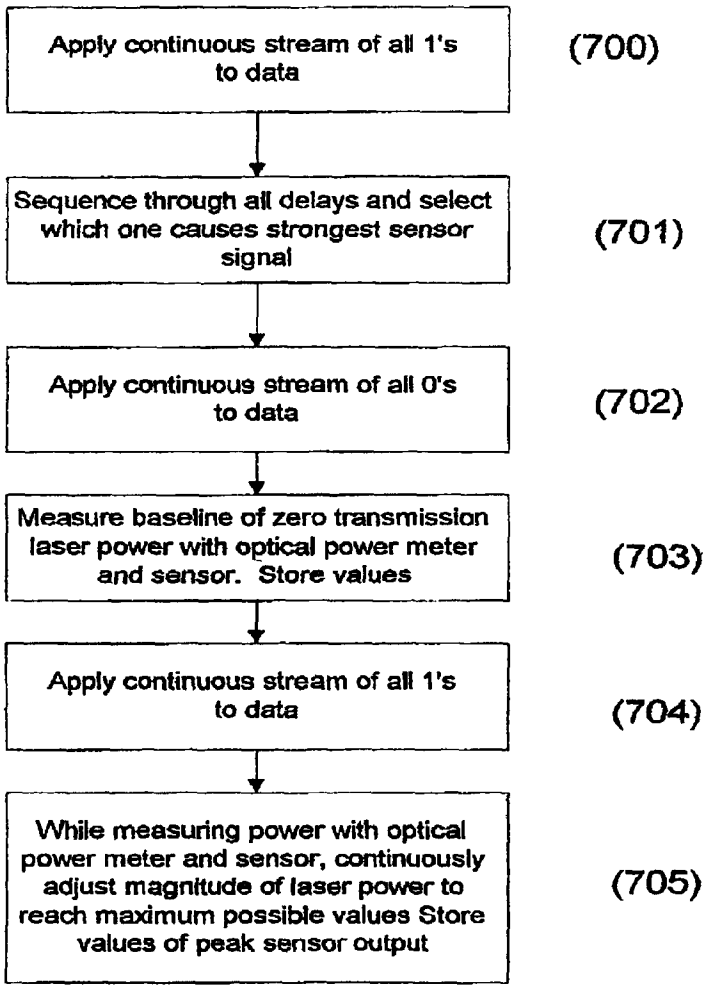
FIG. 7 illustrates the factory calibration of the sensor circuit.

Factory or field calibration of the sensor circuit is shown in FIG. 7.

The amplitude of the sensor signal is first maximized. At 700 apply a continuous stream of all 1's to the data input. At 701, while maintaining the stream of all 1's, sequence Signal Sampler delays 312 to 313. The delay that produces the strongest signal is chosen. At 702, apply a continuous stream of all 0's. At 703, measure the value of the laser power with an optical power meter. Also an A/D conversion to measure the baseline sensor signal for a zero transmission is performed. At 704, then apply a stream of all 1's. At 705, while measuring power with optical power meter, continuously adjust magnitude of laser power by controlling the Modulation Current Generator (103) until the maximum possible value of the laser power output is reached. The corresponding sensor output is measured and stored in the Digital Controller (111).

The above calibration process can be modified for some applications if the process yield characteristics of the laser are understood. In that case, the sensor can still be calibrated but the process does not rely on the Optical Power Meter to determine how much power the laser puts out for all 1's and all 0's. Instead, process parameters can be used to coarsely determine the output power for a given setting of the Modulation Current Generator (103).

During normal operation, a linear interpolation of the values of the sensor between the all 0's value and the all 1's value will determine the measured laser power output. These measured values of power output are then utilized to optimize performance on a continuous manner while the system is operational.

Extinction Ratio and Bit Error Rate Optimization.

The methods are related to ensuring the optimal value of extinction Ratio and minimal Bit Error Rate. The firmware imbedded in the Digital Controller (111) utilizes the results from the A/D conversion of the sensor and proceeds to make adjustments to the amplitude of the peak laser power in response to the logic high sent. The laser power for logic high needs to send a signal with a sufficiently large value according to the transmission protocol. With the precision power measurement circuit of this invention, the laser is not overdriven thus extending operating life. The Digital controller (111) makes adjustments to the minimal optical power in response to the logic low sent and. The minimal optical power is determined by the Bias Current Generator (102) and is adjusted above the threshold of the laser. The current needs to strike a balance between having too low of a value (needed to maximize extinction ratio) or too high of a value (needed to obtain a margin over the lasing threshold and to not operate over the noisy region of the laser near the threshold). Since the above adjustments are performed in a continuous manner, the laser is always operated at the optimal levels of power output.

Remarks and Comments on Some Advantages of the Invention

1. A circuit that precisely calibrates the laser optical power in a continuous manner without disrupting the flow of information in the optical communications link.
2. A method that utilizes knowledge of the measured value of the laser optical power and makes necessary adjustments to optimize the values of the Extinction Ratio and Bit Error Rate.
3. A circuit that can utilize any type of response from the sensing photodiode.
4. A method that utilizes knowledge of the information sent to the optical communications link to determine how the laser should be performing.
5. A circuit and method utilized to compensate for aging, temperature rise and other degradation effects of the laser without interrupting the flow of information transmitted.
6. A circuit and method that compensates for aging, temperature rise and other degradation effects of a laser only as needed at any point in time rather than at the beginning when power is turned on or at the factory.
7. A process that automatically maximizes the magnitude of the photodiode power sensor signal for a laser.
8. A circuit to capture a sense the laser output where the sensing is coordinated with the transmission signal.
9. A circuit as in 8, where the associated timing of the circuit is automatically optimized.

Consequently, while the foregoing description has described the principle and operation of the present invention in accordance with the provisions of the patent statutes, it should be understood that the invention may be practiced otherwise as illustrated and described above and that various changes in the size, shape, and materials, as well as on the details of the illustrated method of operation may be made, within the scope of the appended claims without departing from the spirit and scope of the invention.

What is claimed is:

1. A method for synchronizing capture of laser output samples comprising:

buffering an analog laser drive signal;

delaying the buffered *drive* signal to produce a set of delayed analog drive signals from the buffered drive signal;

selecting a particular delayed analog *drive* signal from the set of delayed analog *drive* signals;

capturing the selected signal in a sample and hold amplifier to produce a delayed analog signal sample;

placing the sample and hold amplifier in a hold mode during an analog to digital conversion of the delayed analog signal sample;

converting the delayed analog signal sample to a digital signal sample; and[,]

resetting the sample and hold amplifier for a next sample capturing cycle.

2. [An] *A* circuit for synchronizing capture of laser output samples comprising:

a buffer for buffering an analog laser drive signal;

a set of signal propagation delays for producing a set of delayed analog drive signals from the buffered drive signal;

a digital multiplexer for selecting a particular delayed analog signal from the set of delayed analog *drive* signals;

a sample and hold amplifier for capturing the selected signal to produce a delayed analog signal sample;

a set reset latch for causing a sample and hold controller to place the sample and hold amplifier in a hold mode during an analog to digital conversion of the delayed *analog* signal *sample*, and to reset the sample and hold amplifier for a next sample capturing cycle; and[,]

an analog to digital converter for converting the delayed analog signal sample to a digital signal sample.

3. The method of claim 1 further comprising:

opening a first switch to disconnect a laser drive signal from a laser driver;

concurrently closing a second switch to connect a [know] *known* test pulse signal to the laser [drive] *driver*; and[.]

calibrating timing for output signal sampling using the known test pulse signal.

4. The method of claim 1 further comprising:

opening a first switch to disconnect a laser drive signal from a laser driver;

concurrently closing a second switch to connect a known test pulse signal to the laser driver; and[.]

calibrating an extinction ratio using the known test pulse signal.

5. The circuit of claim 2 further comprising:

a first switch for disconnecting a laser drive signal from a laser driver; and[,] a second switch for connecting a known test pulse signal to the laser driver.

*6. An apparatus comprising:*

*a sampler configured to sample a photodiode signal to provide a sample signal, wherein the sample signal is configured to serve as at least a partial basis for calibration of a laser module; and*

*a synchronization module operatively coupled with the sampler and configured to:*

*receive a drive signal configured to drive the laser module;*

*delay the drive signal, based at least in part on an input signal received from a controller, to provide a delayed drive signal; and*

*control the sampler to sample the photodiode signal based at least in part on the delayed drive signal.*

*7. The apparatus of claim 6, further comprising the controller operatively coupled with the sampler and the synchronization module and configured to provide the input signal to the synchronization module to correlate sampling of the photodiode signal with the drive signal.*

*8. The apparatus of claim 7, wherein the controller is further configured to provide one or more control signals based at least in part on the sample signal and the apparatus further comprises:*

*the laser module to provide light output; and*

*a driver operatively coupled with the laser module and the controller and configured to:*

*receive the drive signal;*

*receive the one or more control signals from the controller; and*

*drive the laser module, based at least in part on the drive signal and the one or more control signals, to provide the light output.*

*9. The apparatus of claim 8, wherein the controller is further configured to:*

*provide the one or more control signals based at least in part on an extinction ratio or a bit error rate associated with the laser module.*

*10. The apparatus of claim 8, wherein the one or more control signals comprise bias and modulation control signals.*

*11. The apparatus of claim 8, further comprising:*

*a photodiode configured to provide the photodiode signal based at least in part on the light output.*

*12. The apparatus of claim 7, wherein the controller is configured to:*

*select a delay value from a plurality of delay values that results in a peak value of the sample signal; and*

*provide the input signal to implement the delay value.*

*13. The apparatus of claim 6, wherein the synchronization module comprises synchronizer and delay circuits.*

*14. The apparatus of claim 6, wherein the synchronization module is further configured to control the sampler to transition from a sample mode to a hold mode at a time that corresponds to a peak value of the sample signal.*

*15. A method comprising:*

*receiving, by a synchronization module, a drive signal configured to drive a laser module;*

*driving, by the synchronization module, the laser module based at least in part on the drive signal, to provide light output;*

*delaying, by the synchronization module based at least in part on an input signal received from a controller, the drive signal to provide a delayed drive signal; and*

*sampling, by a sampler controlled by the synchronization module, a photodiode signal that corresponds to the light output, based at least in part on the delayed drive signal, to provide a sample signal,*

*wherein said delaying of the drive signal is configured to correlate the sample signal with the drive signal to enable the sample signal to serve as at least a partial basis for calibration of the laser module.*

*16. The method of claim 15, wherein said delaying the drive signal is further configured to provide a sampling transition at a time that corresponds to a peak value of the sample signal.*

*17. The method of claim 16, wherein the sampling transition is a transition from a sample mode to a hold mode of a sampler.*

*18. The method of claim 15, further comprising:*

*calibrating the laser module based at least in part on the sample signal.*

*19. The method of claim 18, wherein said calibrating the laser module comprises:*

*adjusting at least a bias control signal or a modulation control signal.*

*20. The method of claim 19, further comprising adjusting at least the bias control signal or the modulation control signal based on an extinction ratio or bit error rate associated with the laser module.*

* * * * *

UNITED STATES PATENT AND TRADEMARK OFFICE

CERTIFICATE OF CORRECTION

PATENT NO. : RE43,685 E
APPLICATION NO. : 13/048743
DATED : September 25, 2012
INVENTOR(S) : Sanchez It is certified that error appears in the above-identified patent and that said Letters Patent is hereby corrected as shown below:

On the Title Page, item (54), and in Column 1, Line 2, Title, delete "FOR DYNAMIC" and insert -- OF DYNAMIC --, therefor.

In Fig. 3, Sheet 3 of 7, delete "Photodiod sensor" and insert -- Photodiode sensor --, therefor.

In Fig. 7, Sheet 7 of 7, for Tag "(705)", in Line 4, delete "values" and insert -- values. --, therefor.

In Column 2, Line 16, delete "follows." and insert -- follows: --, therefor.

In Column 2, Line 31, delete "(106);" and insert -- (106). --, therefor.

In Column 4, Line 64, delete "then" and insert -- than --, therefor.

In Column 5, Line 29, delete "delay" and insert -- delay. --, therefor.

In Column 5, Line 38, delete "state" and insert -- state. --, therefor.

In Column 5, Line 41, delete "respond" and insert -- respond. --, therefor.

In Column 8, Line 29, delete "submitted" and insert -- substituted --, therefor.

Signed and Sealed this
Twenty-sixth Day of February, 2013

Teresa Stanek Rea
*Acting Director of the United States Patent and Trademark Office*